US008446218B2

(12) United States Patent
Gong et al.

(10) Patent No.: US 8,446,218 B2
(45) Date of Patent: May 21, 2013

(54) POWER AMPLIFIER AND TRANSMITTER

(75) Inventors: Xun Gong, Shanghai (CN); Jie Sun, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/315,717

(22) Filed: Dec. 9, 2011

(65) Prior Publication Data

US 2012/0075018 A1 Mar. 29, 2012

Related U.S. Application Data

(63) Continuation of application No. PCT/CN2010/073687, filed on Jun. 8, 2010.

(30) Foreign Application Priority Data

Jun. 12, 2009 (CN) .......................... 2009 1 0146114

(51) Int. Cl.
  *H03F 3/68* (2006.01)
(52) U.S. Cl.
  USPC ......... 330/124 R; 330/295; 330/302; 330/310
(58) Field of Classification Search
  USPC ...................... 330/124 R, 295, 302, 310, 53
  See application file for complete search history.

(56) References Cited

U.S. PATENT DOCUMENTS

| | | | |
|---|---|---|---|
| 6,262,629 B1 * | 7/2001 | Stengel et al. | 330/124 R |
| 6,407,635 B2 * | 6/2002 | Mucenieks et al. | 330/149 |
| 7,301,395 B2 * | 11/2007 | Mobbs | 330/124 R |
| 7,612,607 B2 * | 11/2009 | Harima | 330/124 R |
| 7,741,904 B2 * | 6/2010 | Ichitsubo et al. | 330/133 |

(Continued)

FOREIGN PATENT DOCUMENTS

| | | |
|---|---|---|
| CN | 1501578 A | 6/2004 |
| CN | 1627656 A | 6/2005 |

(Continued)

OTHER PUBLICATIONS

3GPP TS 36.212 V9.2.0 (Jun. 2006); *Technical Specification*; $3^{rd}$ Generation partnership Project; Technical Specification Group Radio Access Network; Evolved Universal Terrestrial Radio Access (E-UTRA); Multiplexing and channel coding (Release 9).

(Continued)

*Primary Examiner* — Patricia Nguyen

(74) *Attorney, Agent, or Firm* — Leydig, Voit & Mayer, Ltd.

(57) ABSTRACT

A power amplifier is provided, which includes a power dividing unit, a first power amplification tributary, a second power amplification tributary, and an impedance conversion unit. Input ends of the first power amplification tributary and the second power amplification tributary are coupled to two output ends of the power dividing unit respectively. An output end of the first power amplification tributary is coupled to an output end of the second power amplification tributary through the impedance conversion unit. Rated power of a peak power amplifier in the second power amplification tributary is greater than that of a main power amplifier in the first power amplification tributary. The beneficial effects of the present invention lie in that larger back-off exists at the peak of an efficiency curve of the power amplifier, and in the case that power is back-off, efficiency of the power amplifier is improved.

20 Claims, 2 Drawing Sheets

U.S. PATENT DOCUMENTS

| | | | |
|---|---|---|---|
| 2003/0076167 A1* | 4/2003 | Hellberg | 330/124 R |
| 2004/0113698 A1 | 6/2004 | Kim et al. | |
| 2006/0145757 A1 | 7/2006 | Kim et al. | |
| 2007/0126502 A1 | 6/2007 | Louis | |
| 2007/0205827 A1 | 9/2007 | Mobbs | |
| 2008/0111630 A1 | 5/2008 | Harima | |
| 2008/0122542 A1 | 5/2008 | Bowles et al. | |
| 2008/0231358 A1 | 9/2008 | Maemura | |
| 2009/0051438 A1 | 2/2009 | Okubo et al. | |

FOREIGN PATENT DOCUMENTS

| | | |
|---|---|---|
| CN | 1822492 A | 8/2006 |
| CN | 1943106 A | 4/2007 |
| CN | 1976217 A | 6/2007 |
| CN | 101087161 A | 12/2007 |
| CN | 101151798 A | 3/2008 |
| CN | 101582682 A | 11/2009 |
| CN | 101582682 B | 12/2011 |
| JP | 2006333022 A | 12/2006 |
| WO | WO 2004/088837 A3 | 10/2004 |
| WO | WO 2006/102466 A2 | 9/2006 |

OTHER PUBLICATIONS

English Translation of the International Search Report relating to PCT/CN2010/073687; dated (mailed) Sep. 16, 2010 for Huawei Tech Co., Ltd.

English Translation of the Written Opinion of the International Searching Authority related to PCT/CN2010/073687; dated (mailed) Sep. 16, 2010 for Huawei Tech Co., Ltd.

First Chinese Office Action (translation) of Chinese Patent Application No. 200910146114.6; dated (mailed) Nov. 10, 2010; Chinese version attached.

Second Chinese Office Action (translation) of Chinese Patent Application No. 200910146114.6; dated (mailed) Apr. 25, 2011; Chinese version attached.

Extended European Search Report dated (mailed) Mar. 1, 2012, issued in related Application No. 10785747.6-2215, PCT/CN2010073687, filed Feb. 22, 2012, Hauwei Technologies Co., Ltd.

Ghim, et al., A High Gain Doherty Amplifier Using Embedded Drivers, Dept. Of Radio Science and Engineering, Kwangwoon University, Korea, 2006, 4 pages.

Crescenzi et al., 60 Watt Doherty Amplifiers Using High Gain 2-Stage Hybrid Amplifier Modules, Cree Microwave Corporation, Sunnyvale, CA, 2005, 4 pages.

Gajadharsing et al., Analysis and Design of a 200W LDMOS Based Doherty Amplifier for 3G Base Stations, Philips Semiconductors, BU Mobile Communications, Nijmegen, The Netherlands, WE5A-3, 4 pages.

1st Office Action in corresponding European Patent Application No. 10785747.6 (Oct. 23, 2012).

* cited by examiner

POWER AMPLIFIER AND TRANSMITTER

CROSS-REFERENCE TO RELATED APPLICATIONS

This application is a continuation of International Application No. PCT/CN2010/073687, filed on Jun. 8, 2010, which claims priority to China Patent Application No. 200910146114.6, filed with the Chinese Patent Office on Jun. 12, 2009, all of which are incorporated herein by reference in their entirety.

FIELD OF THE INVENTION

The present invention relates to the field of wireless communications, and in particular, to a power amplifier and a transmitter.

BACKGROUND OF THE INVENTION

In a wireless communication system, as a core element, a power amplifier has a function of amplifying a signal, so that the signal can be amplified to be at a sufficient power level, so as to implement transmission, long distance delivery and reliable receiving of the signal.

With the development of wireless communications technologies in modern times, in order to implement data transmission at a high code rate, some signals with a large dynamic range and a high Peak-to-Average Ratio begin to be used widely, for example, a Wideband Code Division Multiple Access (WCDMA) signal, and a typical value of a Peak-to-Average Ratio of the signal ranges 7 to 10 dB. Therefore, the power amplifier is required to have better linearity when peak power is output, and at the same time, is required to have high efficiency when average power is output.

A Doherty power amplifier is a widely used power amplification technology with high efficiency and low complexity currently. FIG. 1 is a structural diagram of a Doherty power amplifier in the prior art. The Doherty power amplifier generally includes two parts: a main power amplifier and a peak power amplifier. When input power is relatively small, the peak power amplifier is turned off. At this time, output impedance of the peak power amplifier is regarded as infinity, and output impedance of the main power amplifier is twice matched impedance. When a current reaches a half of a matched output current, the main power amplifier is saturated. At this time, power of the Doherty power amplifier reaches the peak, that is, saturation power of a class-AB power amplifier. As the input power is increased, the peak power amplifier is turned on. According to a load pull principle, the output impedance seen from a peak power amplifier port is increased. After passing through a ¼ wavelength microstrip, the output impedance of the main power amplifier is decreased, and output power of the main power amplifier may be increased continuously. Output voltage of the main power amplifier keeps the same, but the output power is increased continuously because a load is decreased. At this time, the main power amplifier still works in a saturation state, so that the Doherty power amplifier may still maintain higher efficiency.

The peak power amplifier is biased in a class-C state, and a gain of the peak power amplifier is lower, so that it cannot be ensured that the output power is the same as that of the main power amplifier when the saturation power is output. Since the output power is insufficient, a gain curve of the Doherty power amplifier has a step, thus influencing the linearity of the Doherty power amplifier during large power output. FIG. 2 is a curve diagram showing output of a Doherty power amplifier in the prior art.

In the prior art, in order to ensure that the peak power amplifier has sufficient power output, the peak power amplifier is generally turned on in advance before the main power amplifier is saturated. However, during implementation of the present invention, the inventors of the present invention find that the prior art has the following disadvantages. At this time, since the main power amplifier does not reach the efficiency peak, the turning the peak power amplifier on in advance causes that the efficiency of the whole Doherty power amplifier during power back-off is reduced. Furthermore, a certain static current is leaked out before the peak power amplifier is turned on, and the current generates power loss, thus influencing the efficiency of the Doherty power amplifier.

SUMMARY OF THE INVENTION

An embodiment of the present invention provides a power amplifier, which includes:

a power dividing unit, a first power amplification tributary, a second power amplification tributary, and an impedance conversion unit, where an input end of the first power amplification tributary and an input end of the second power amplification tributary are coupled to two output ends of the power dividing unit respectively; and an output end of the first power amplification tributary is coupled to an output end of the second power amplification tributary through the impedance conversion unit.

the impedance conversion unit is configured to perform conversion of output impedance of the first power amplification tributary;

the power dividing unit is configured to output a divided power signal to the input end of the first power amplification tributary and the input end of the second power amplification tributary;

the first power amplification tributary includes a main power amplifier, configured to amplify the power signal that is received by the first power amplification tributary and output by the power dividing unit, and output an amplified power signal through the output end of the first power amplification tributary;

the second power amplification tributary includes a peak power amplifier driver, a first inter-stage matching unit, and a peak power amplifier which are sequentially connected in series, where the peak power amplifier driver is configured to amplify the received power signal output by the power dividing unit, and then output a power signal amplified by the peak power amplifier driver to the peak power amplifier through the first inter-stage matching unit; the peak power amplifier is configured to amplify a power signal amplified by the peak power amplifier driver, and output an amplified power signal through the output end of the second power amplification tributary; and the first inter-stage matching unit is configured to match impedance of the peak power amplifier driver with impedance of the peak power amplifier, and rated power of the peak power amplifier driver is less than that of the peak power amplifier; and the rated power of the peak power amplifier is greater than that of the main power amplifier, and when the first power amplification tributary is saturated, the second power amplification tributary begins to amplify the received power signal.

An embodiment of the present invention further provides a transmitter, which includes: a signal processing unit, a signal amplification unit, and a signal transmission unit, where the signal processing unit transmits a processed signal to the signal amplification unit, then the signal amplification unit amplifies the processed signal, and then the signal transmission unit transmits the amplified signal to a space, and the signal amplification unit is the foregoing power amplifier.

Since rated power of a power transistor of a peak power amplifier is greater than that of a power transistor of a main power amplifier, when saturation power is output, a ratio of power output of the peak power amplifier to power output of the main power amplifier may be adjusted, so that larger back-off exists at the peak of a efficiency curve of the power amplifier provided in this embodiment of the present invention.

BRIEF DESCRIPTION OF THE DRAWINGS

The accompanying drawings here are used to provide further understanding of the present invention and constitute a part of this specification, but not intended to limit the present invention. In the accompanying drawings.

DETAILED DESCRIPTION OF THE EMBODIMENTS

In order to make the objectives, technical solutions, and advantages of the present invention more clearly, the present invention is further described in detail in the following with reference to the embodiments and the accompanying drawings. Herein, the exemplary embodiments of the present invention and descriptions of the embodiments are intended to explain the present invention, but not intended to limit the present invention.

The embodiments of the present invention provide a power amplifier and a transmitter. The present invention is described in the following in detail with reference to the accompanying drawings.

Figure 1:
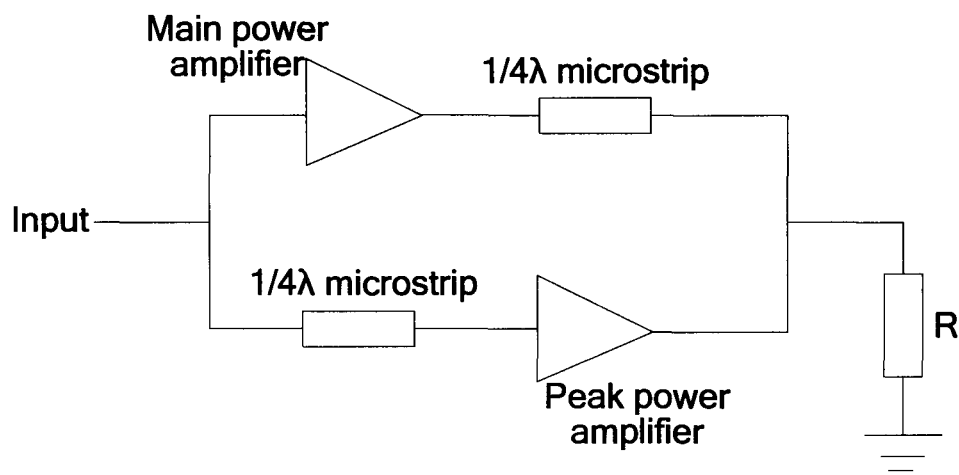
FIG. 1 is a structural diagram of a Doherty power amplifier in the prior art.
Figure 2:
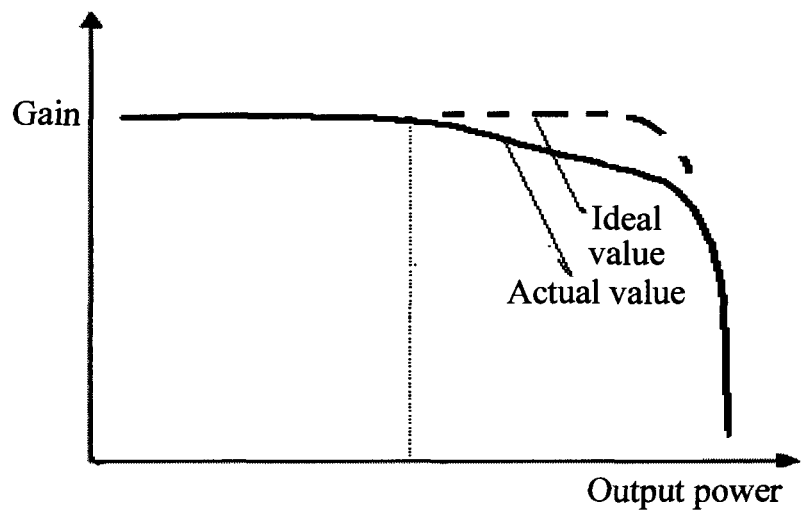
FIG. 2 is a curve diagram showing output of the Doherty power amplifier in the prior art.
Figure 3:
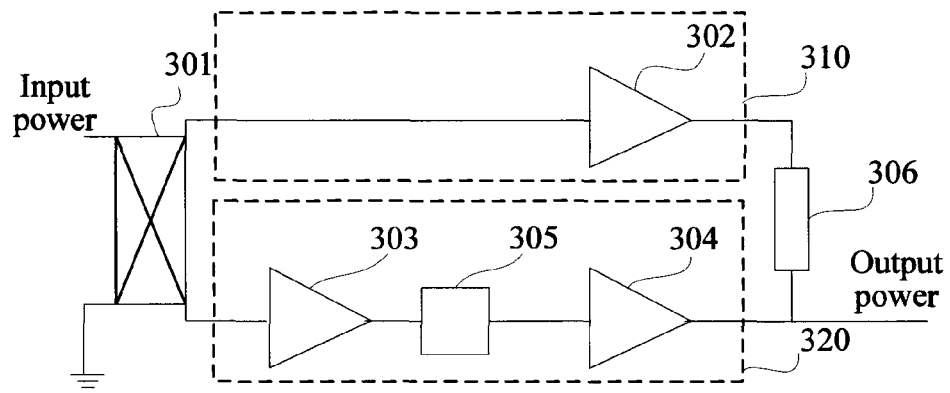
FIG. 3 is a schematic structural diagram of a power amplifier according to a first embodiment of the present invention.

FIG. 3 is a schematic structural diagram of a power amplifier according to a first embodiment of the present invention.

The power amplifier includes a power dividing unit 301, a first power amplification tributary 310, a second power amplification tributary 320, and an impedance conversion unit 306. An input end of the first power amplification tributary 310 and an input end of the second power amplification tributary 320 are coupled to two output ends of the power dividing unit 301 respectively. An output end of the first power amplification tributary 310 is coupled to an output end of the second power amplification tributary 320 through the impedance conversion unit 306.

The impedance conversion unit 306 is configured to perform conversion of output impedance of the first power amplification tributary.

The power dividing unit 301 is configured to output a divided power signal to the input end of the first power amplification tributary 310 and the input end of the second power amplification tributary 320.

The first power amplification tributary 310 includes a main power amplifier 302, configured to amplify the power signal received by the first power amplification tributary 310 and output an amplified power signal through the output end of the first power amplification tributary 310.

The second power amplification tributary 320 includes a peak power amplifier driver 303, a first inter-stage matching unit 305, and a peak power amplifier 304 which are sequentially connected in series. The peak power amplifier driver 303 is configured to receive and amplify the power signal, and then output the power signal amplified by the peak power amplifier driver 303 to the peak power amplifier 304 through the first inter-stage matching unit 305. The peak power amplifier 304 is configured to amplify the power signal amplified by the peak power amplifier driver 303 and output an amplified power signal through the output end of the second power amplification tributary 320. The first inter-stage matching unit 305 is configured to match impedance of the peak power amplifier driver 303 with impedance of the peak power amplifier 304. Rated power of the peak power amplifier driver 303 is less than that of the peak power amplifier 304.

The rated power of the peak power amplifier 304 is greater than that of the main power amplifier 302. When the first power amplification tributary 310 is saturated, the second power amplification tributary 320 begins to amplify the received power signal.

The rated power of the peak power amplifier driver 303 is less than that of the peak power amplifier 304, so that static current leakage of the peak power amplifier 304 before being turned on may be restricted, thus improving efficiency of the whole Doherty power amplifier.

The inter-stage matching unit 305 is not only configured to match the impedance of the peak power amplifier driver 303 with the impedance of the peak power amplifier 304, but also satisfies requirements of output power of the peak power amplifier driver 303 and an input standing wave of the peak power amplifier 304 at the same time, or may match output of the peak power amplifier driver 303 and input of the peak power amplifier respectively and connect the output of the peak power amplifier driver 303 and the input of the peak power amplifier through an isolator.

The impedance conversion unit 306 is configured to perform conversion of the output impedance of the first power amplification tributary 310. As an embodiment of the present invention, the output impedance of the first power amplification tributary may be converted into impedance of an external load of the whole power amplifier, so as to achieve power synthesis output of output power of the two power amplification tributaries. As an embodiment of the present invention, the impedance conversion unit may be a ¼ wavelength microstrip.

The main power amplifier 302 works in a class-AB state, and the peak power amplifier 304 and the peak power amplifier driver 303 work in a class-B state or a class-C state. During specific implementation, when the main power amplifier is saturated, according to a specific situation of a circuit, the peak power amplifier can be turned on simultaneously by adjusting a grid voltage of the peak power amplifier 304 and a grid voltage of the peak power amplifier driver 303.

In this embodiment, since the rated power of the peak power amplifier 304 is greater than that of the main power amplifier 302, back-off at the efficiency peak of the whole Doherty power amplifier may be increased. For example, in the prior art, a main power amplifier and a peak power amplifier are both a 100 W power amplifier. When small power is input, output impedance of the main power amplifier is twice matched impedance. When the main power amplifier outputs half-power (that is, 50 W), the main power amplifier is saturated, and efficiency reaches the peak. For 200 W full power output, back-off is 6 dB. In this embodiment of the present invention, the peak power amplifier 304 adopts 120 W, and the main power amplifier 302 adopts 100 W. By appropriately selecting impedance of a combiner line and impedance of output microstrips of the main power amplifier and the peak power amplifier, when small power is input, output impedance of the main power amplifier is 2.22 times the matched impedance, and when saturation power is output, the output impedance of the main power amplifier and the peak power amplifier are both the matched impedance. Under this circumstance, the main power amplifier 302 is saturated when outputting 45 W, relatively, the saturation power output is 220 W, and the back-off is 6.85 dB.

Through the preceding embodiment of the present invention, the main power amplifier is saturated when outputting power less than the half-power. At this time, the efficiency peak is reached. In this embodiment of the present invention, when the saturation power of the power amplifier is output, since output of the peak power amplifier is greater than output of the main power amplifier, a sum of the output power of the peak power amplifier and the output power of the main power amplifier is greater than four times the output power at the efficiency peak, that is, larger back-off exists at the peak of an efficiency curve of the power amplifier in this embodiment of the present invention.

Figure 4:
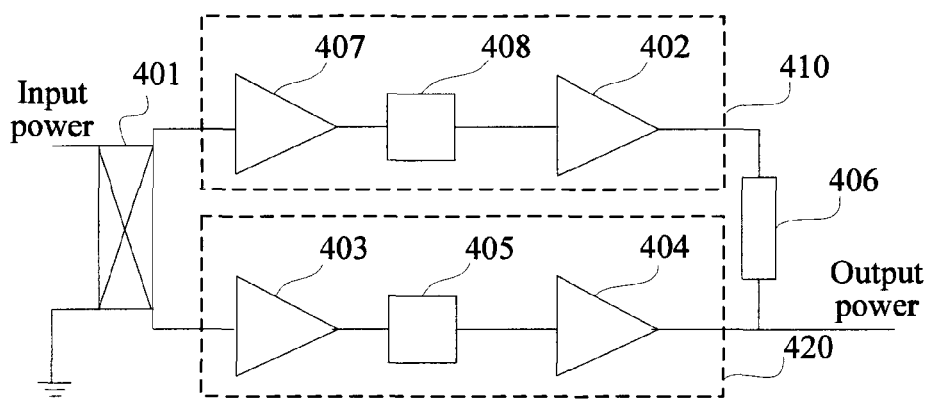
FIG. 4 is a schematic structural diagram of a power amplifier according to a second embodiment of the present invention.

FIG. 4 is a schematic structural diagram of a power amplifier according to a second embodiment of the present invention.

The power amplifier includes a power dividing unit 401, a first power amplification tributary 410, a second power amplification tributary 420, and an impedance conversion unit 406. An input end of the first power amplification tributary 410 and an input end of the second power amplification tributary 420 are coupled to two output ends of the power dividing unit 401 respectively. An output end of the first power amplification tributary 410 is coupled to an output end of the second power amplification tributary 420 through the impedance conversion unit 406.

The impedance conversion unit 406 is configured to perform conversion of output impedance of the first power amplification tributary 410.

The power dividing unit 401 is configured to output a divided power signal to the input end of the first power amplification tributary 410 and the input end of the second power amplification tributary 420.

The first power amplification tributary 410 includes a main power amplifier 402, a main power amplifier driver 407, and a second inter-stage matching unit 408. The main power amplifier driver 407, the second inter-stage matching unit 408, and the main power amplifier 402 are sequentially connected in series. The main power amplifier driver 407 is configured to receive and amplify the power signal received by the first power amplification tributary 410, and then output the power signal amplified by the main power amplifier driver 407 to the main power amplifier 402 through the second inter-stage matching unit 408. The main power amplifier 402 is configured to amplify the power signal amplified by the main power amplifier driver 407 and output an amplified power signal through the output end of the first power amplification tributary 410. The second inter-stage matching unit 408 is configured to match impedance of the main power amplifier driver 407 with impedance of the main power amplifier 402. Rated power of the main power amplifier driver 407 is less than that of the main power amplifier 402.

The second power amplification tributary 420 includes a peak power amplifier driver 403, a first inter-stage matching unit 405, and a peak power amplifier 404 which are sequentially connected in series. The peak power amplifier driver 403 is configured to receive and amplify the power signal, and then output the power signal amplified by the peak power amplifier driver 403 to the peak power amplifier 404 through the first inter-stage matching unit 405. The peak power amplifier 404 is configured to amplify the power signal amplified by the peak power amplifier driver 403 and output an amplified power signal through the output end of the second power amplification tributary 420. The first inter-stage matching unit 405 is configured to match impedance of the peak power amplifier driver 403 with impedance of the peak power amplifier 404. Rated power of the peak power amplifier driver 403 is less than that of the peak power amplifier 404.

The rated power of the peak power amplifier 404 is greater than that of the main power amplifier 402. When the first power amplification tributary 410 is saturated, the second power amplification tributary 420 begins to amplify the received power signal.

The rated power of the peak power amplifier driver 403 is less than that of the peak power amplifier 404, so that static current leakage of the peak power amplifier 404 before being turned on may be restricted. A driving stage (that is, the peak power amplifier driver) is added before peak power amplification, so that static current leakage of a power transistor of the peak power amplifier driver before being turned on can be much less than that of a power transistor of the peak power amplifier before being turned on. Before the peak power amplifier is turned on, efficiency of the power amplifier in this embodiment is improved.

The impedance conversion unit 406 is configured to perform conversion of output impedance of the first power amplification tributary 410, so as to achieve power synthesis output of output power of the two power amplification tributaries. As an embodiment of the present invention, the impedance conversion unit may be a ¼ wavelength microstrip.

The rated power of the main power amplifier driver 407 is less than that of the main power amplifier 402, and is configured to receive the input power signal, so as to increase a gain of the main power amplifier 402, so that when the main power amplifier 402 is saturated, the gain of the main power amplifier 402 is equal to a gain of the peak power amplifier 404.

As an embodiment of the present invention, the main power amplifier driver 407 is a plurality of power amplifiers connected in series, and the peak power amplifier driver 403 is a plurality of power amplifiers connected in series.

As an embodiment of the present invention, the gain of the peak power amplifier 404 is greater than that of the main power amplifier 402. For example, a power divider 401 is 3 dB bridge input. The main power amplifier driver 407 works in a class-AB state, and the peak power amplifier driver 403 works in a class-B state or a class-C state. The main power amplifier 402 selects a power transistor whose rated power is 100 W, and whose gain is 15 dB when biased in the class-AB state. The peak power amplifier 404 selects a power transistor whose rated power is 100 W, and whose gain is 18 dB when biased in the class-AB state. Since the peak power amplifier driver 403 and the peak power amplifier 404 are both biased in the class-C state, compared with a gain of each power transistor in the class-AB state, an actual gain of each power transistor is decreased by 1 to 2 dB, and a cascade gain of two power transistors is decreased by approximately 3 dB. The gain of the peak power amplifier 404 is 3 dB greater than that of the main power amplifier, so that gain loss is compensated, and output capability of the peak power amplifier 404 is ensured, thus improving performance of the whole power amplifier.

As an embodiment of the present invention, in the case that the gain of the peak power amplifier 404 is the same as that of the main power amplifier 402, the gain of the peak power amplifier driver 403 is greater than the gain of the main power amplifier driver 407, and in the same way, the foregoing effect may be achieved.

As an embodiment of the present invention, the power divider 401 may use a 5 dB bridge to change a power dividing ratio. A dividing ratio of power input into the main power amplifier 402 to power input into the peak power amplifier 404 is 1:2, (the power dividing ratio is not limited in the present invention and is only taken as an example for clear illustration here), that is, power input into the second power amplification tributary (that is, the peak power amplifier driver 403 and the peak power amplifier 404) is 3 dB greater than power input into the first power amplification tributary (that is, the main power amplifier driver 407 and the main power amplifier 402). Therefore, when the main power amplifier 404 is saturated, output power of the peak power amplifier 404 is increased accordingly.

In the preceding embodiment of the present invention, an input power ratio of the peak power amplifier to the main power amplifier is adjusted, so as to improve the output capability of the peak power amplifier, so that after the main power amplifier is saturated, the peak power amplifier can output sufficient power to ensure linearity of the power amplifier. In this way, the peak power amplifier does not need to be turned on in advance, efficiency of the power amplifier is improved, and efficiency of Doherty power amplifier during power back-off may be improved.

Figure 5:
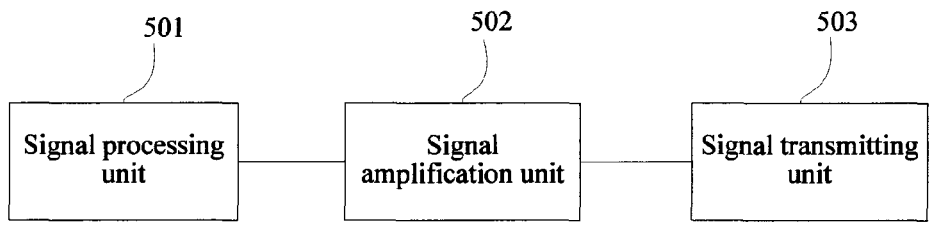
FIG. 5 is a schematic structural diagram of a transmitter according to an embodiment of the present invention.

FIG. 5 is a schematic structural diagram of a transmitter according to an embodiment of the present invention.

The transmitter includes a signal processing unit 501, a signal amplification unit 502, and a signal transmitting unit 503. The signal processing unit 501 delivers a processed signal to the signal amplification unit 502. After amplified, an amplified signal is transmitted to a space by the signal transmitting unit 503. The signal amplification unit 502 is the power amplifier described in the preceding embodiment.

The transmitter may be applied to, for example, a base station. If the power amplifier in the embodiment of the present invention is applied, output power linearity of the transmitter or the base station may be ensured.

Beneficial effects of the embodiments of the present invention lie in that, since the rated power of the power transistor of the peak power amplifier is greater than that of the power transistor of the main power amplifier, when the saturation power is output, the ratio of the power output of the peak power amplifier to the power output of the main power amplifier may be adjusted. When the saturation power is output, and the rated power of the peak power amplifier is greater than that of the main power amplifier, larger back-off exists at the peak of the efficiency curve of the power amplifier.

The driving stage (that is, the peak power amplifier driver) is added before the peak power amplification, so that the static current leakage of the power transistor of the peak power amplifier driver before being turned on can be much less than that of the power transistor of the peak power amplifier before being turned on. Before the peak power amplifier is turned on, the efficiency of the power amplifier is improved.

Moreover, in consideration that the traditional symmetrical Doherty must be turned on in advance since the peak power amplifier is biased in the class-C state and the gain and output power are insufficient, so that the efficiency is reduced. In the embodiment of the present invention, the power amplifier adopts an asymmetrical structure, and the output power of the peak power amplifier is increased by selecting an appropriate power transistor, and adjusting power dividing for the main power amplifier and the peak power amplifier, so that output efficiency of the main power amplifier and the peak power amplifier is higher, and furthermore, the output of the peak power amplifier may satisfy a requirement that good linearity of the power amplifier is still maintained after the main power amplifier is saturated. When the saturation power is output, output power of the peak power amplifier is the same as that of the main power amplifier, thus ensuring that the main power amplifier and the peak power amplifier both work in an optimal state when the saturation power of the power amplifier is output.

The objectives, technical solutions, and beneficial effects of the present invention have been described in further detail through the preceding specific embodiments. It should be understood that the preceding descriptions are merely specific embodiments of the present invention, but are not intended to limit the protection scope of the present invention. Any modification, equivalent replacement, and improvement made without departing from the spirit and principle of the present invention shall all fall within the protection scope of the present invention.

What is claimed is:

1. A power amplifier, comprising:
a power dividing unit, a first power amplification tributary, a second power amplification tributary, and an impedance conversion unit, wherein an input end of the first power amplification tributary and an input end of the second power amplification tributary are coupled to two output ends of the power dividing unit respectively, and an output end of the first power amplification tributary is coupled to an output end of the second power amplification tributary through the impedance conversion unit;
the impedance conversion unit is configured to perform conversion of output impedance of the first power amplification tributary;
the power dividing unit is configured to output a divided power signal to the input end of the first power amplification tributary and the input end of the second power amplification tributary;
the first power amplification tributary comprises a main power amplifier, configured to amplify the power signal that is received by the first power amplification tributary and output by the power dividing unit, and output an amplified power signal through the output end of the first power amplification tributary;
the second power amplification tributary comprises a peak power amplifier driver, a first inter-stage matching unit, and a peak power amplifier which are sequentially connected in series, wherein the peak power amplifier driver is configured to amplify a received power signal output by the power dividing unit, and then output a power signal amplified by the peak power amplifier driver to the peak power amplifier through the first inter-stage matching unit; the peak power amplifier is configured to amplify the power signal amplified by the peak power amplifier driver and output an amplified power signal through the output end of the second power amplification tributary; the first inter-stage matching unit is configured to match impedance of the peak power amplifier driver with impedance of the peak power amplifier; and rated power of the peak power amplifier driver is less than that of the peak power amplifier; and
the rated power of the peak power amplifier is greater than that of the main power amplifier, and the second power amplification tributary is configured to begin amplifying the received power signal when the first power amplification tributary is saturated.

2. The power amplifier according to claim 1, wherein the first power amplification tributary further comprises a main power amplifier driver and a second inter-stage matching unit; the main power amplifier driver, the second inter-stage matching unit, and the main power amplifier are sequentially connected in series; the main power amplifier driver is configured to receive and amplify the power signal that is received by the first power amplification tributary and output by the power dividing unit, and then output a power signal amplified by the main power amplifier driver to the main power amplifier through the second inter-stage matching unit; the main power amplifier is further configured to amplify a power signal amplified by the main power amplifier driver and output an amplified power signal through the output end of the first power amplification tributary; the second inter-stage matching unit is configured to match impedance of the main power amplifier driver with impedance of the main power amplifier, and rated power of the main power amplifier driver is less than that of the main power amplifier.

3. The power amplifier according to claim 2, wherein a gain of the peak power amplifier driver is greater than that of the main power amplifier driver.

4. The power amplifier according to claim 1, wherein a gain of the peak power amplifier is greater than that of the main power amplifier.

5. The power amplifier according to claim 4, wherein the power dividing unit is an asymmetrical power divider.

6. The power amplifier according to claim 1, wherein the power dividing unit is an asymmetrical power divider.

7. The power amplifier according to claim 1, wherein the main power amplifier driver is a plurality of power amplifiers connected in series.

8. The power amplifier according to claim 1, wherein the peak power amplifier driver is a plurality of power amplifiers connected in series.

9. The power amplifier according to claim 1, wherein the main power amplifier and the main power amplifier driver are biased in a class-AB state, and the peak power amplifier and the peak power amplifier driver are biased in a class-B state or a class-C state.

10. The power amplifier according to claim 1, wherein the impedance conversion unit is a microstrip.

11. A transmitter, comprising: a signal processing unit, a signal amplification unit, and a signal transmitting unit, wherein the signal processing unit delivers a processed signal to the signal amplification unit; after amplified by the signal amplification unit, the signal is transmitted to a space by the signal transmitting unit; and the signal amplification unit is the power amplifier, comprising:
  a power dividing unit, a first power amplification tributary, a second power amplification tributary, and an impedance conversion unit, wherein an input end of the first power amplification tributary and an input end of the second power amplification tributary are coupled to two output ends of the power dividing unit respectively, and an output end of the first power amplification tributary is coupled to an output end of the second power amplification tributary through the impedance conversion unit;
  the impedance conversion unit is configured to perform conversion of output impedance of the first power amplification tributary;
  the power dividing unit is configured to output a divided power signal to the input end of the first power amplification tributary and the input end of the second power amplification tributary;
  the first power amplification tributary comprises a main power amplifier, configured to amplify the power signal that is received by the first power amplification tributary and output by the power dividing unit, and output an amplified power signal through the output end of the first power amplification tributary;
  the second power amplification tributary comprises a peak power amplifier driver, a first inter-stage matching unit, and a peak power amplifier which are sequentially connected in series, wherein the peak power amplifier driver is configured to amplify a received power signal output by the power dividing unit, and then output a power signal amplified by the peak power amplifier driver to the peak power amplifier through the first inter-stage matching unit; the peak power amplifier is configured to amplify the power signal amplified by the peak power amplifier driver and output an amplified power signal through the output end of the second power amplification tributary; the first inter-stage matching unit is configured to match impedance of the peak power amplifier driver with impedance of the peak power amplifier; and rated power of the peak power amplifier driver is less than that of the peak power amplifier; and
  the rated power of the peak power amplifier is greater than that of the main power amplifier, and the second power amplification tributary is configured to begin amplifying the received power signal when the first power amplification tributary is saturated.

12. The transmitter according to claim 11, wherein the first power amplification tributary further comprises a main power amplifier driver and a second inter-stage matching unit; the main power amplifier driver, the second inter-stage matching unit, and the main power amplifier are sequentially connected in series; the main power amplifier driver is configured to receive and amplify the power signal that is received by the first power amplification tributary and output by the power dividing unit, and then output a power signal amplified by the main power amplifier driver to the main power amplifier through the second inter-stage matching unit; the main power amplifier is further configured to amplify a power signal amplified by the main power amplifier driver and output an amplified power signal through the output end of the first power amplification tributary; the second inter-stage matching unit is configured to match impedance of the main power amplifier driver with impedance of the main power amplifier, and rated power of the main power amplifier driver is less than that of the main power amplifier.

13. The transmitter according to claim 12, wherein a gain of the peak power amplifier driver is greater than that of the main power amplifier driver.

14. The transmitter according to claim 11, wherein a gain of the peak power amplifier is greater than that of the main power amplifier.

15. The transmitter according to claim 14, wherein the power dividing unit is an asymmetrical power divider.

16. The transmitter according to claim 11, wherein the power dividing unit is an asymmetrical power divider.

17. The transmitter according to claim 11, wherein the main power amplifier driver is a plurality of power amplifiers connected in series.

18. The transmitter according to claim 11, wherein the peak power amplifier driver is a plurality of power amplifiers connected in series.

19. The transmitter according to claim 11, wherein the main power amplifier and the main power amplifier driver are biased in a class-AB state, and the peak power amplifier and the peak power amplifier driver are biased in a class-B state or a class-C state.

20. The transmitter according to claim 11, wherein the impedance conversion unit is a microstrip.

* * * * *